(12) United States Patent
Suzuki et al.

(10) Patent No.: US 8,821,990 B2
(45) Date of Patent: Sep. 2, 2014

(54) DLC FILM-FORMING METHOD AND DLC FILM

(75) Inventors: Masahiro Suzuki, Kashiba (JP);
Toshiyuki Saito, Kashiba (JP);
Kazuyoshi Yamakawa, Nishinomiya (JP)

(73) Assignee: JTEKT Corporation, Osaka-shi (JP)

( * ) Notice: Subject to any disclaimer, the term of this patent is extended or adjusted under 35 U.S.C. 154(b) by 314 days.

(21) Appl. No.: 13/378,689

(22) PCT Filed: Jun. 9, 2010

(86) PCT No.: PCT/JP2010/059774
§ 371 (c)(1),
(2), (4) Date: Dec. 16, 2011

(87) PCT Pub. No.: WO2010/147038
PCT Pub. Date: Dec. 23, 2010

(65) Prior Publication Data
US 2012/0094074 A1    Apr. 19, 2012

(30) Foreign Application Priority Data

Jun. 19, 2009 (JP) ................. 2009-146732
Sep. 24, 2009 (JP) ................. 2009-219190
May 18, 2010 (JP) ................. 2010-114438

(51) Int. Cl.
*C23C 16/26* (2006.01)
*F16D 69/00* (2006.01)
*C23C 16/02* (2006.01)
*C23C 16/515* (2006.01)

(52) U.S. Cl.
CPC ............ *C23C 16/0245* (2013.01); *F16D 69/00* (2013.01); *C23C 16/26* (2013.01); *C23C 16/515* (2013.01)

USPC .......................... 427/577; 427/249.1

(58) Field of Classification Search
USPC ................ 427/249.1, 577; 428/408
See application file for complete search history.

(56) References Cited

U.S. PATENT DOCUMENTS 6,468,602 B2 * 10/2002 Sakaguchi et al. ......... 427/249.1
6,740,393 B1 * 5/2004 Massler et al. .............. 428/408

(Continued)

FOREIGN PATENT DOCUMENTS

DE        102 13 661 A1   10/2003
GB         2401116    * 11/2004

(Continued)

OTHER PUBLICATIONS

The Extended European Search Report issued Jul. 29, 2013, in Application No. / Patent No. 10789413.1-1353 / 2444520 PCT/JP2010059774.

(Continued)

*Primary Examiner* — Archene Turner
(74) *Attorney, Agent, or Firm* — Oblon, Spivak, McClelland, Maier & Neustadt, L.L.P.

(57) ABSTRACT

The present invention provides a DLC film that has good adhesiveness even in a low-temperature environment, and a DLC film-forming method capable of forming this DLC film. The present invention also provides a DLC film that has excellent initial compatibility, and a DLC film-forming method capable of forming this DLC film. In the present invention, a first opposing surface (31) that faces an inner clutch plate, of a substrate (30) of an outer clutch plate (15) is covered by a DLC film (26). Also, a treatment layer (33) is formed on a surface layer portion of the substrate (30). The treatment layer (33) is formed by applying direct-current pulse voltage to the substrate (30), and generating plasma in an atmosphere that contains argon gas and hydrogen gas.

3 Claims, 9 Drawing Sheets

(56) References Cited

U.S. PATENT DOCUMENTS

| | | | |
|---|---|---|---|
| 7,303,789 B2 * | 12/2007 | Saito et al. | 427/577 |
| 2005/0242156 A1 | 11/2005 | Jabs et al. | |

FOREIGN PATENT DOCUMENTS

| | | |
|---|---|---|
| JP | 2001-214269 | 8/2001 |
| JP | 2004 277800 | 10/2004 |
| JP | 2007 092108 | 4/2007 |
| JP | 2007-191754 | 8/2007 |
| JP | 2009 035584 | 2/2009 |
| JP | 2009 185336 | 8/2009 |
| JP | 2010 174310 | 8/2010 |
| WO | 2008 081650 | 7/2008 |
| WO | WO 2009/033017 A1 | 3/2009 |

OTHER PUBLICATIONS

International Search Report Issued Sep. 21, 2010 in PCT/JP10/59774 Filed Jun. 9, 2010.

* cited by examiner

DLC FILM-FORMING METHOD AND DLC FILM

TECHNICAL FIELD

The present invention relates to a DLC film-forming method and a DLC film.

BACKGROUND ART

For example, a reduction in sliding resistance of slide members mounted in automobiles is desired to reduce fuel consumption of automobiles. Therefore, a structure in which the surface of a slide member is covered with a DLC (Diamond Like Carbon) film that has low frictional properties and abrasion resistance (high hardness properties) is known.

A DLC film is formed by a Direct Current Plasma CVD (Direct Current Plasma Chemical Vapor Deposition) method, for example. A direct current plasma type treatment system illustrated in Patent Document 1, for example, is used to form a DLC film. In that direct current plasma type treatment system, plasma is generated inside a treatment chamber by direct-current voltage being applied to a substrate with the inside of the treatment chamber being in a reduced pressure state of a hydrogen carbonate-based source gas atmosphere. Then the source gas is turned into plasma, and a deposition layer of DLC forms on the surface of the substrate.

Meanwhile, nitriding treatment is carried out on the surface of the substrate before the deposition of DLC according to the direct current plasma CVD method. The nitriding treatment and the forming of the deposition layer of DLC are carried out using the same treatment system, for example. That is, in the nitriding treatment, plasma is generated inside the treatment chamber by direct-current voltage being applied to the substrate in a reduced pressure state in a nitrogen gas atmosphere. Also, the nitrogen gas is turned into plasma, and a nitrided layer is formed on the surface of the substrate. The deposition layer of DLC according to the direct current plasma CVD method is formed on this nitrided layer.

The direct current plasma type system illustrated in Patent Document 1 generates plasma continuously during treatment, so the temperature of the treatment chamber (i.e., the treatment temperature) reaches 500 to 600° C. in both the nitriding treatment and the process for depositing (forming) the DLC film.

PRIOR ART DOCUMENT

Patent Document

Patent Document 1: Japanese Patent Application Publication No. 2009-35584

OUTLINE OF THE INVENTION

Problem to be Solved by the Invention

However, with the treatment system in Patent Document 1 in which the treatment temperature reaches a high temperature of 500 to 600° C., a DLC film is not able to be formed on a substrate made of material that is not heat resistant. Therefore, the selection range of substrate materials on which a DLC film can be formed is narrow. If the DLC film can be formed in a low-temperature environment, the selection range of substrate materials becomes wider, which is desirable. Therefore, the inventors of the present application are investigating the formation of a DLC film in a low-temperature environment of equal to or less than 300° C.

However, in order to form a nitrided layer, the treatment temperature need to be equal to or greater than approximately 500° C. It is not possible to form a nitrided layer on the surface of a substrate at a treatment temperature of equal to or less than 300°. If the nitrided layer is not formed, adhesiveness between the substrate and the DLC film after the formation of the DLC film may deteriorate.

Furthermore, there is a problem in that compatibility of the DLC film with the other material during the initial period of usage (hereinafter, referred to as the "initial compatibility") is poor. One of the reasons for this is thought to be that the surface of the DLC film is rough as a result of the DLC film being affected by the surface state of the substrate. Therefore, the inventors of the present application are investigating improving the initial compatibility of the DLC film by improving the surface state of the substrate on which the DLC film is formed.

Therefore, one object of the present invention is to provide a DLC film that has good adhesiveness, even in a low-temperature environment, and a DLC film-forming method capable of forming this DLC film.

Also, one object of the present invention is to provide a DLC film with excellent initial compatibility, and a DLC film-forming method capable of forming this DLC film.

Means for Solving the Problem

A DLC film-forming method of the present invention is a method for forming, inside a treatment chamber, a DLC film that covers at least a portion of a surface of a substrate, the DLC film-forming method including a pretreatment process that is executed in a reduced pressure state of a predetermined treatment pressure generated by a low-vacuum pump, and that supplies Ar ions and H ions to the surface of the substrate by applying direct-current pulse voltage to the substrate, and generating plasma in an atmosphere that includes argon gas and hydrogen-based gas inside the treatment chamber; and a DLC deposition process that is executed after the pretreatment process in the reduced pressure state, and that forms a deposition layer of DLC on the surface of the substrate after the pretreatment process is executed, by applying direct-current pulse voltage to the substrate, and generating plasma in an atmosphere inside the treatment chamber. In the pretreatment process and the DLC deposition process, a treatment time of both of the processes, the predetermined treatment pressure in both of the processes, or a frequency, duty ratio, or voltage value of the direct-current pulse voltage applied to the substrate in both of the processes, is set such that a temperature of the substrate becomes equal to or less than 300° C.

Effects of the Invention

According to the DLC film-forming method of the present invention, it is possible to form a DLC film with good adhesiveness even in a low-temperature environment, and this DLC film.

Also, according to the DLC film-forming method of the present invention, a DLC film with excellent initial compatibility, and a DLC film-forming method capable of forming this DLC film are able to be provided.

MODES FOR CARRYING OUT THE INVENTION

Hereinafter, example embodiments of the present invention will be described in detail with reference to the drawings.

In this specification, "hydrogen-based gas" is intended to include gas that includes hydrogen atoms, such as hydrocarbon gas and ammonia gas, besides hydrogen gas.

Figure 1:
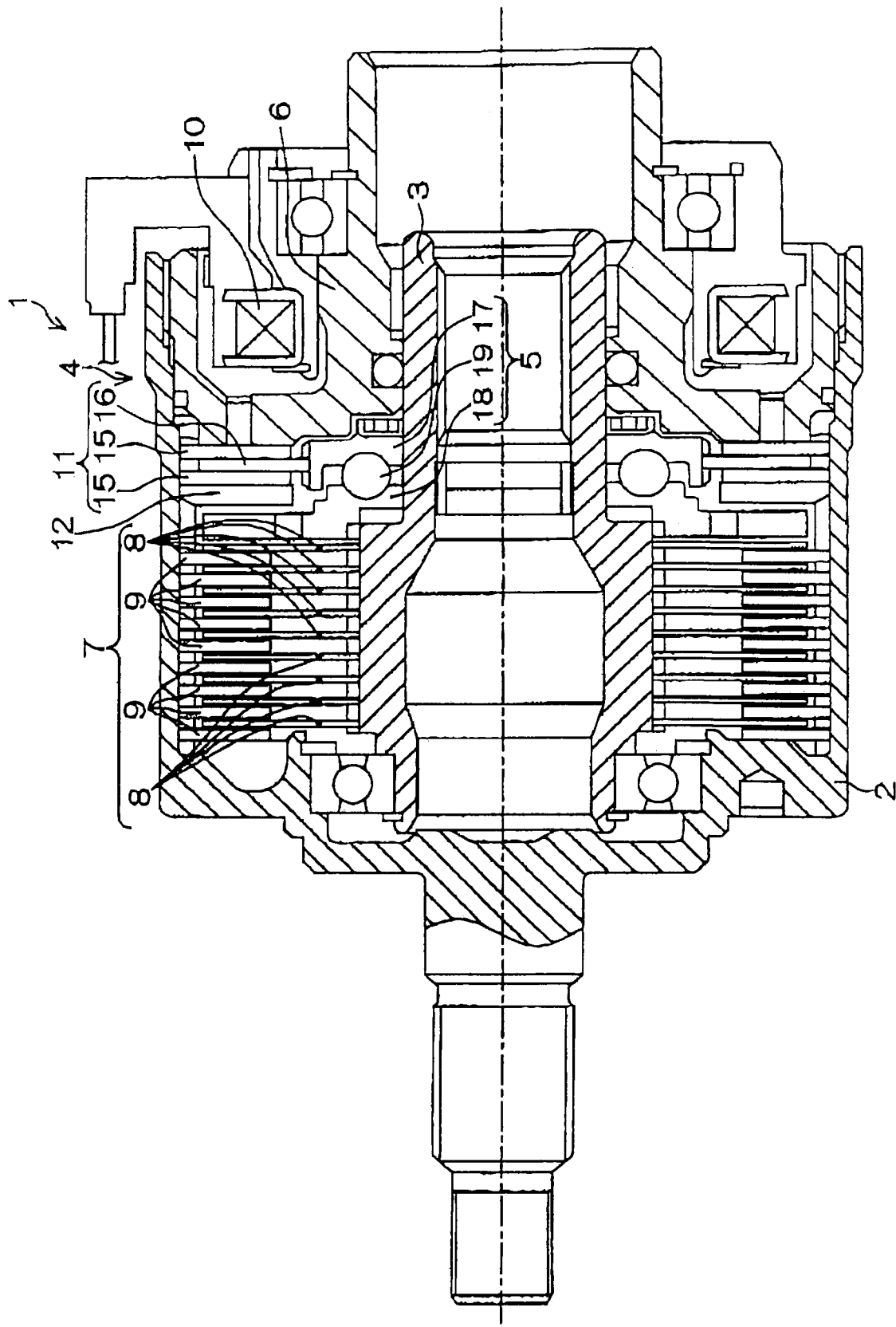
FIG. 1 is a sectional view schematically showing the structure of a driving force transmitting apparatus that incorporates an outer clutch having a DLC film according to a first example embodiment of the present invention formed on a surface.

FIG. 1 is a sectional view schematically showing the structure of a driving force transmitting apparatus 1 that incorporates outer clutch plates 15 having a DLC film 26 according to one example embodiment (a first example embodiment) of the present invention formed on a surface. The driving force transmitting apparatus 1 is mounted in a four wheel drive vehicle, for example, and is used to transmit driving force applied from a propeller shaft (not shown) side to a pinion shaft (not shown). The driving force transmitting apparatus 1 includes an input casing 2, an output shaft 3, a pilot clutch mechanism 4, a cam mechanism 5, and a main clutch mecha-nism 7. The input casing 2 is connected to the propeller shaft (not shown), and the output shaft 3 is connected to the pinion shaft (not shown).

The input casing 2 has a closed-end cylindrical shape. The opening of a rear portion (the right side shown in FIG. 1) of the input casing 2 is covered by a rear casing 6. The pilot clutch mechanism 4, the cam mechanism 5, and the main clutch mechanism 7 are housed in the input casing 2. The main clutch mechanism 7 is formed from a wet type multiple disc clutch mechanism. In the main clutch mechanism 7, multiple inner clutch plates 8 and outer clutch plates 9 are alternately arranged.

The output shaft 3 passes through a center portion of the rear casing 6, and is inserted inside the input casing 2. The output shaft 3 is provided so as to be rotatable with respect to the input casing 2 and the rear casing 6.

The pilot clutch mechanism 4 includes an electromagnetic coil 10, a friction clutch 11, and an armature 12. The armature 12 has an annular shape, and is arranged along the inner periphery of the input casing 2. The armature 12 is spline-engaged with the input casing 2, and as a result, is allowed to move in the axial direction with respect to the input casing 2. The armature 12 is arranged facing one side of the friction clutch 11. The friction clutch 11 includes two iron outer clutch plates 15, and one inner clutch plate 16 that is sandwiched between these two outer clutch plates 15.

The cam mechanism 5 includes a first cam member 17 and a second cam member 18. The first cam member 17 and the second cam member 18 are arranged facing each other. The first cam member 17 is provided so as to be rotatable with respect to the output shaft 3. The second cam member 18 is spline-engaged with the output shaft 3, and is thus provided so as to be able to rotate together with the output shaft 3. Also, the second cam member 18 is allowed to move in the axial direction with respect to the output shaft 3. A plurality of cam grooves that extend in the circumferential direction are provided at intervals in the opposing surfaces of the first and second cam members 17, 18. A ball-shaped cam follower 19 is interposed fit into the cam grooves, between the first cam member 17 and the second cam member 18. The cam grooves become shallower from the center portion in the circumferential direction toward both end portions.

The outer clutch plates 15 and the inner clutch plate 16 have annular disc shapes. The inner clutch plate 16 is arranged between the two outer clutch plates 15. The outer clutch plates 15 and the inner clutch plate 16 are provided so as to be able to move toward and away from each other. When the outer clutch plates 15 and the inner clutch plate 16 abut against each other, the inner clutch plate 16 and the outer clutch plates 15 frictionally contact each other. Also, when the inner clutch plate 16 and the outer clutch plates 15 are apart from each other, they do not contact each other. The inner clutch plate 16 is spline-engaged with the outer periphery of the first cam member 17, and as a result, is allowed to move in the axial direction with respect to the first cam member 17. The outer clutch plates 15 are spline-engaged with the inner periphery of the input casing 2, and are allowed to move in the axial direction with respect to the input casing 2.

Lubricating oil is filled inside a housing chamber formed by the input casing 2 and the rear casing 6. The clutch plates 15, 16 of the pilot clutch mechanism 4 and the clutch plates 8, 9 of the main clutch mechanism 7 are lubricated by this lubricating oil. When the electromagnetic coil 10 is not energized, the pilot clutch mechanism 4 is in a deactivated state. Therefore, the main clutch mechanism 7 is in a deactivated state. As a result, running torque input into the input casing 2 is not transmitted to the output shaft 3, so the vehicle is in a two wheel drive driving mode.

When the electromagnetic coil 10 is energized, the armature 12 moves toward the electromagnetic coil 10 by the attraction of the electromagnetic coil 10, so the armature 12 friction-engages with the friction clutch 11. Also, the first cam member 17 and the input casing 2 side are connected by the armature 12 and the friction clutch 11 friction-engaging. As a result, the first cam member 17 rotates together with the rotation of the input casing 2, and thus rotates relative to the second cam member 18. Also, the second cam member 18 moves to the main clutch mechanism 7 side by the cam follower 19 riding up on the shallow places of the cam groove. As a result, the outer clutch plates 9 and the inner clutch plates 8 friction-engage, such that the input casing 2 and the output shaft 3 become connected, and running torque input into the input casing 2 is transmitted to the output shaft 3. As a result, the vehicle is in a four wheel drive driving mode.

Also, changing the amount of current to the electromagnetic coil 10 causes the attraction force generated in the armature 12 to change in proportion to the amount of current. This is converted into force in the axial direction by the cam mechanism 5, and friction torque proportional to the amount of current is generated.

Figure 2:
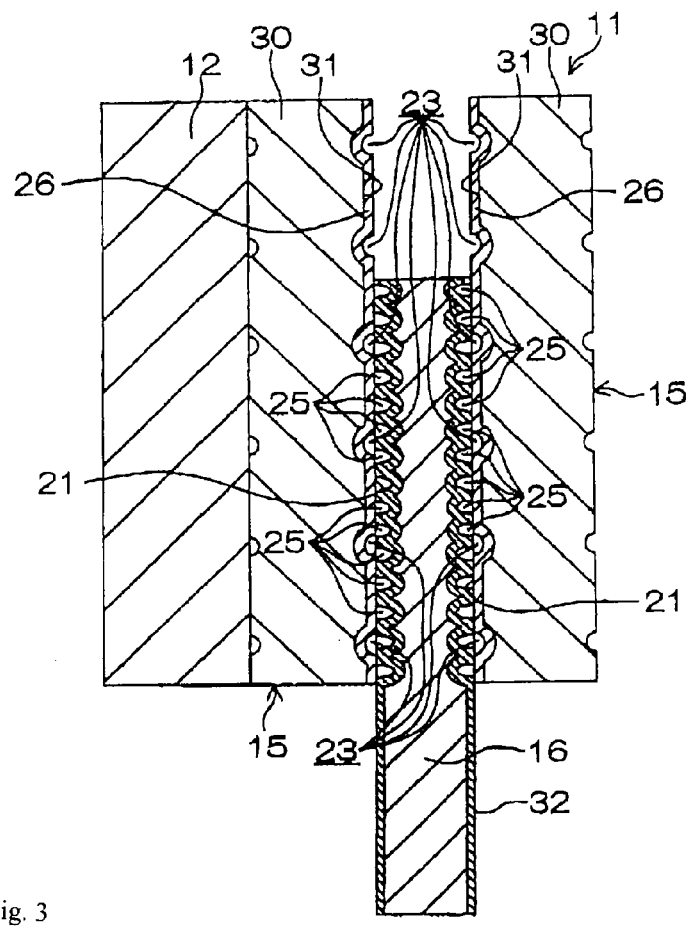
FIG. 2 is a sectional view of a friction clutch shown in FIG. 1.

FIG. 2 is a sectional view of the friction clutch 11.

The outer clutch plates 15 and the inner clutch plate 16 include a substrate 30 formed using tool steel (such as SKH51 or SKH4, for example). A mesh-shaped (net-like) lubricating oil groove 32 for receiving residual lubricating oil between the clutch plates 15, 16 is formed in a first opposing surface 31 that faces the inner clutch plate 16, of the substrate 30 of the outer clutch plates 15. The first opposing surface 31 of the substrate 30 is covered by the DLC film 26. A first sliding surface 21 that slides with the inner clutch plate 16 is formed on the surface of the DLC film 26.

Also, multiple grooves 25 that are extremely narrow are arranged at extremely small intervals on the entire region of a second sliding surface 32 that slides with the outer clutch plates 15, of the inner clutch plate 16. In FIG. 2, the grooves 25 are shown exaggerated to facilitate understanding; but the width and pitch of the grooves 25 are set to approximately several μm, for example.

Figure 3:
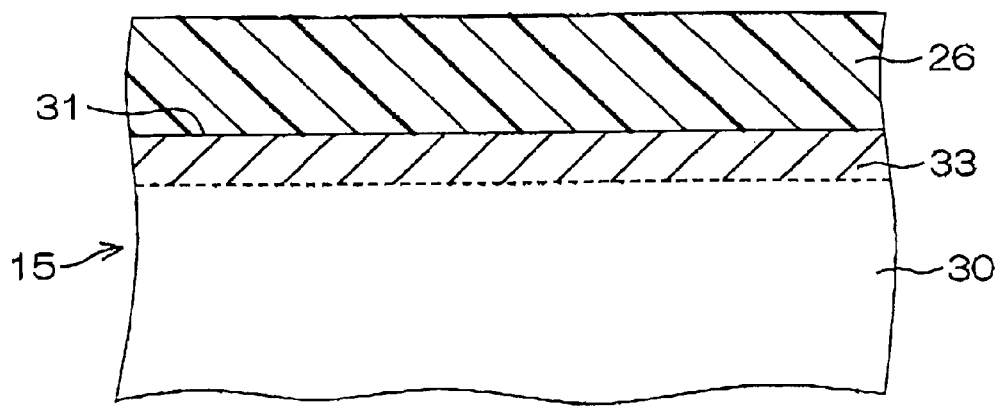
FIG. 3 is an enlarged sectional view of the DLC film shown in FIG. 2.

FIG. 3 is an enlarged sectional view of the DLC film 26 shown in FIG. 2.

A treatment layer 33 is formed on the first opposing surface 31 (the surface of the substrate 30) of the substrate 30 of the outer clutch plates 15. In other words, a surface layer portion of the outer clutch plates 15 is formed by the treatment layer 33. The treatment layer 33 contains various elements, for example, Ar, H, C, and N. The DLC film 26 is formed on this treatment layer 33. The DLC film 26 is formed by a deposition layer of DLC according to a direct current plasma CVD method. The thickness of the DLC film 26 is, for example, 1.0 to 6.0 μm, and the nanoindentation hardness of the DLC film 26 is approximately 10 to 30 GPa. The DLC film 26 contains Si at a predetermined ratio (for example, approximately 10 to 20 wt %).

The treatment layer 33 is formed by ions (mainly Ar ions and H ions) being supplied. Although not shown in FIG. 3, minute asperities are formed on the surface of the treatment layer 33. That is, the surface of this treatment layer 33 is roughed appropriately. The surface of this treatment layer 33 functions as a boundary surface with the DLC film 26. Because minute asperities are formed on the surface, this treatment layer 33 has excellent adhesiveness with the DLC film 26.

Figure 4:
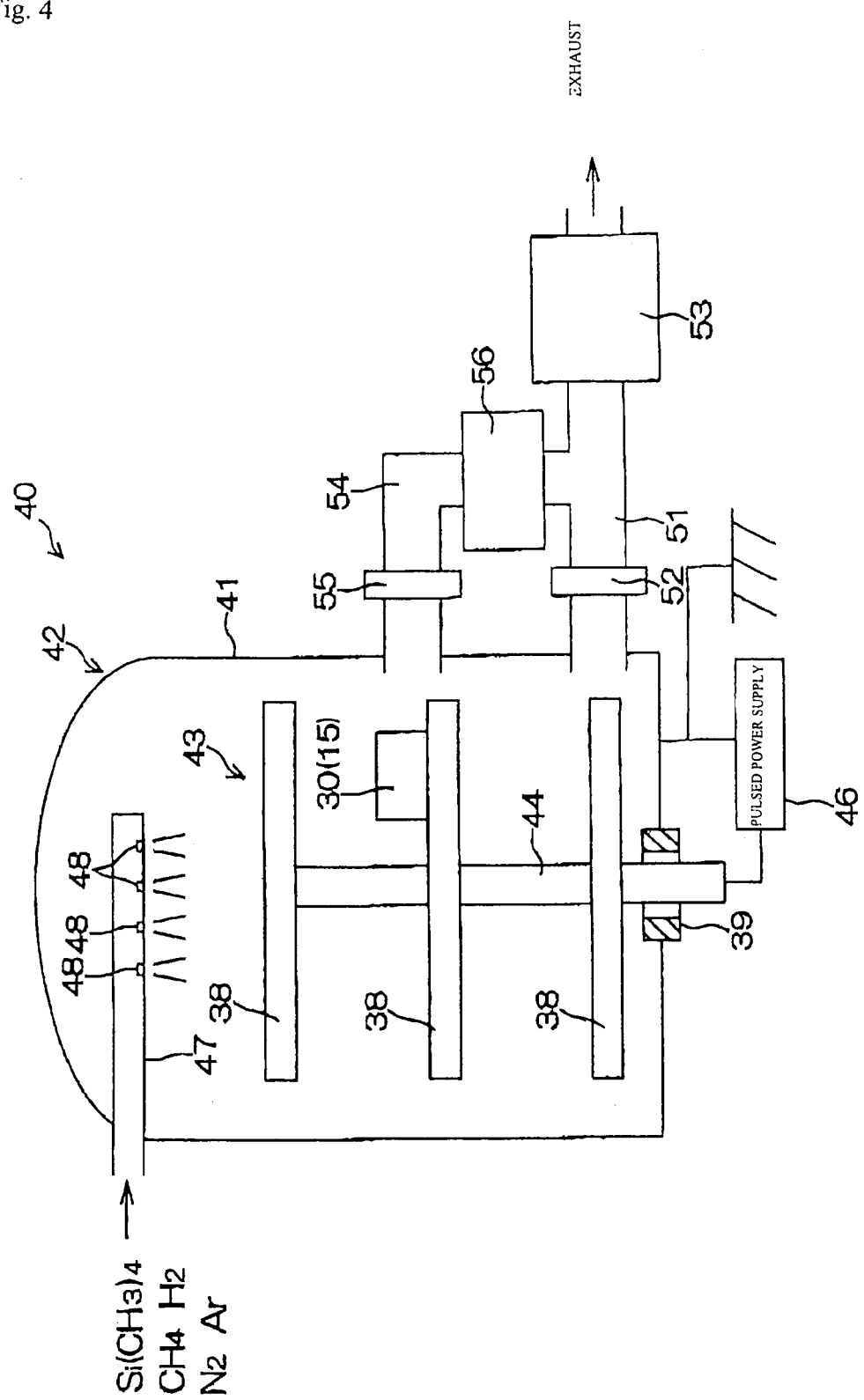
FIG. 4 is a sectional view showing a frame format of a structure of a system used in forming a treatment layer and the DLC film.

FIG. 4 is a sectional view showing a frame format of the structure of a treatment system 40 used in forming the DLC film 26. The DLC film 26 can be prepared by a direct-current pulse plasma CVD method using this treatment system 40.

This treatment system 40 includes a treatment chamber 42 that is surrounded by a partition wall 41. This partition wall 41 is formed using conductive material such as stainless steel or the like. A base 43 for holding the substrate 30 (the outer clutch plates 15) that is the object to be treated is housed inside the treatment chamber 42. This base 43 includes support plates 38 that support the substrate 30 from below, and a support shaft 44 that extends in the vertical direction and supports the support plates 38. The support plates 38 have a horizontal posture. In this example embodiment, a three tiered object in which three support plates 38 are arranged lined up in the up-down direction is employed as the base 43.

Also, the base 43 (that is, the support plates 38 and the support shaft 44) is formed using conductive material such as steel. A direct-current pulsed power supply (direct-current pulsed power supply) 46 is electrically connected to the base 43. Direct-current pulse voltage is output, as will be described later in detail, from the pulsed power supply 46. A set voltage value of the pulsed power supply 46 is set to approximately −1000 V, for example. That is, when the pulsed power supply 46 is on, a negative direct-current pulse voltage of a 1000 V is applied to the base 43. That is, the base 43 functions as a negative electrode.

The partition wall 41 of the treatment chamber 42 is grounded. The partition wall 41 and the base 43 are insulated by an insulating portion 39. Therefore, the partition wall 41 is kept at ground potential.

Also, a temperature sensor (not shown) for measuring the temperature of the substrate 30 that is supported on the base 43 is arranged in the treatment chamber 42. The temperature sensor monitors whether the temperature of the substrate 30 exceeds a preset low temperature (for example, 300° C.).

A source gas introducing conduit 47 extends horizontally above the base 43 inside the treatment chamber 42. Multiple discharge holes 48 aligned along the longitudinal direction of the source gas introducing conduit 47 are formed in a portion that faces the base 43, of the source gas introducing conduit 47. Methane gas ($CH_4$) as an example of hydrocarbon gas, hydrogen gas ($H_2$), argon gas (Ar), nitrogen gas ($N_2$), and tetramethylsilane gas (($Si(CH_3)_4$); hereinafter, referred to as "TMS") are supplied to the source gas introducing conduit 47. A plurality of branch introducing conduits (not shown) for introducing the source gas from a gas cylinder (not shown) that is a supply source of each source gas to the treatment chamber is connected to the source gas introducing conduit 47. A flow regulating valve (not shown) for regulating the flowrate of gas introduced from the gas cylinder into the treatment chamber 42 is interposed in each branch introducing conduit (not shown).

A first exhaust conduit 51 for discharging the atmosphere that is inside the treatment chamber 42 is connected to the partition wall 41 of the treatment chamber 42. The tip end of this first exhaust conduit 51 is connected to exhaust equipment (not shown). A first regulating valve 52 and a first pump 53 are interposed in this order from the treatment chamber 42 side in a midway portion of the first exhaust conduit 51. The first regulating valve 52 is used to regulate the treatment pressure inside the treatment chamber 42 by adjusting the opening amount. A low-vacuum pump such as an oil-sealed rotary vacuum pump (a rotary pump) or a diaphragm vacuum pump, for example, is used as the first pump 53. The oil-sealed rotary vacuum pump is a positive-displacement type vacuum pump that aims to decrease the airtight space and the waste space between parts such as the rotor, the stator, and the sliding vanes with oil. A sliding vane rotary vacuum pump and a rotary plunger vacuum pump are examples of the oil-sealed rotary vacuum pump employed as the first pump 53.

With a sliding vane rotary vacuum pump, two vanes mounted on a rotor are rotated in a state constantly pushed against a stator by a spring, and gas is transferred by the change in the volume of the space surrounded by the vanes, the rotor, and the stator. Also, with a rotary plunger vacuum pump, an outer portion of a cylindrical portion that is guided by a plunger that slides in a stator airtight portion rotates, while maintaining a minute clearance on the stator inside surface and being sealed by oil, following the up and down swivel movement of the plunger caused by the rotation of an eccentric rotor. Gas is transferred by a change in the volume of the space surrounded by the plunger, the cylinder, and the stator.

The pressure reached by the oil-sealed rotary vacuum pump is usually relatively high (for example, several tens to several hundred Pa). Therefore, by employing an oil-sealed rotary vacuum pump as the first pump 53, the inside of the treatment chamber 42 after a pressure decrease will not become an extremely low pressure (for example, equal to or less than 10 Pa).

A second exhaust conduit 54 for discharging the atmosphere that is inside the treatment chamber 42 is connected to the partition wall 41 of the treatment chamber 42. The tip end of this second exhaust conduit 54 is connected to a midway portion of the first exhaust conduit 51, more specifically, between the first pump 53 and the first regulating valve 52. A second regulating valve 55 and a second pump 56 are interposed in this order from the treatment chamber 42 side in a midway portion of the second exhaust conduit 54. The second regulating valve 55 is used to regulate the treatment pressure inside the treatment chamber 42 by adjusting the opening amount. A high-vacuum pump such as a turbo-molecular pump or an oil diffusion pump, for example, is used as the second pump 56.

Figure 5:
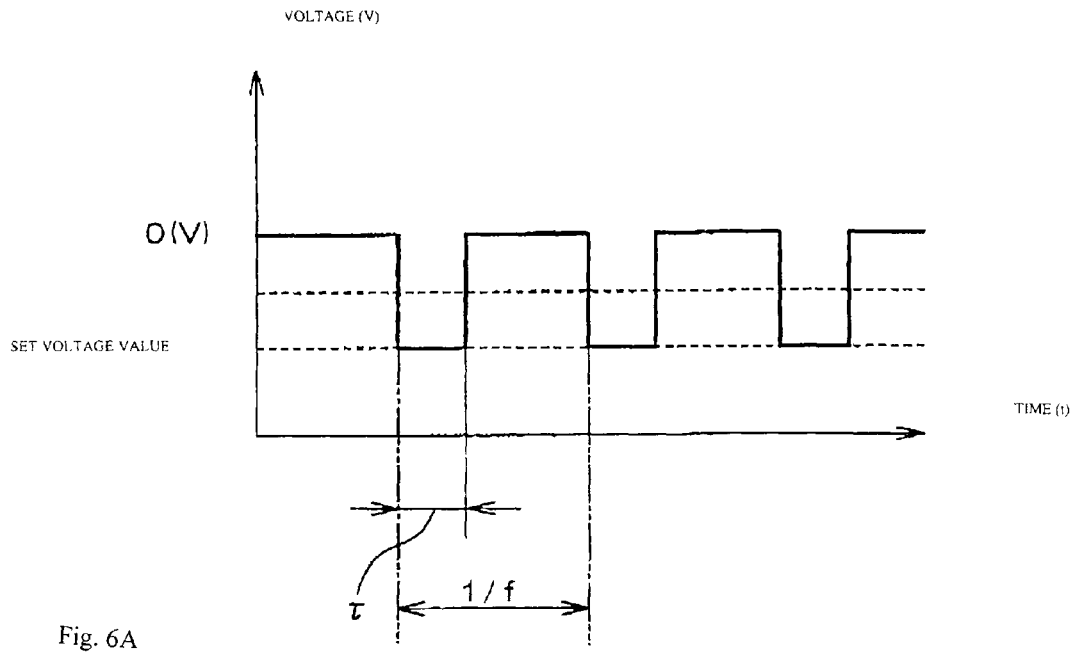
FIG. 5 is a view for illustrating a pulse output from a pulsed power supply.

FIG. 5 is a view showing the waveform of direct-current pulse voltage output from the pulsed power supply 46. The set voltage value of this direct-current pulse voltage is set to a value of approximately −1000 V, for example. Pulse-like voltage is output from the pulsed power supply 46, so even if the direct-current pulse voltage is such a high voltage, no abnormal discharge will occur in the treatment chamber 42.

The pulse period of the direct-current pulse voltage can be expressed by the reciprocal (1/f) of the frequency f of the pulse. When the applied time of the direct-current pulse voltage (the pulse width of the direct-current pulse voltage) is $\tau$, the duty ratio is a value obtained by dividing the applied time by the pulse period, and can be expressed by Expression (1) below.

$$\text{Duty ratio}=\tau \times f \quad (1)$$

In order to improve the adhesiveness between the substrate 30 and the DLC film 26, normally nitriding treatment is performed on the surface of the substrate 30 before DLC deposition. However, in order to perform nitriding treatment on the surface of the substrate 30, the inside of the treatment chamber 42 in which the substrate 30 is housed need to be in a high temperature environment of equal to or higher than 500 to 600° C. The treatment system 40 is a system for forming the DLC film 26 in a low-temperature environment of equal to or less than 300° C. (approximately 200° C., for example), so the nitriding treatment cannot be performed on the substrate 30 using this treatment system 40. Therefore, with pretreatment that will be described later, the treatment layer 33 (see FIG. 3) is formed on a surface layer portion of the substrate 30, and as a result, adhesiveness between the substrate 30 and the DLC film 26 after DLC deposition improves. In this example embodiment, the treatment layer 33 and the DLC film 26 are formed using the treatment system 40.

Figure 6A:
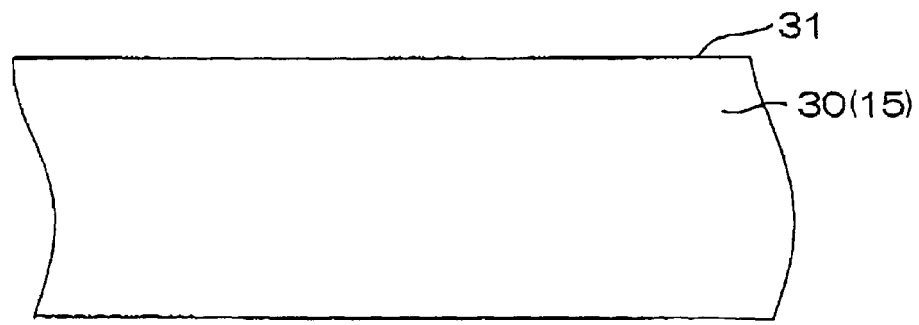
FIG. 6A is a graphic sectional view showing an object to be treated of a forming method of the treatment layer and the DLC film.
Figure 6B:
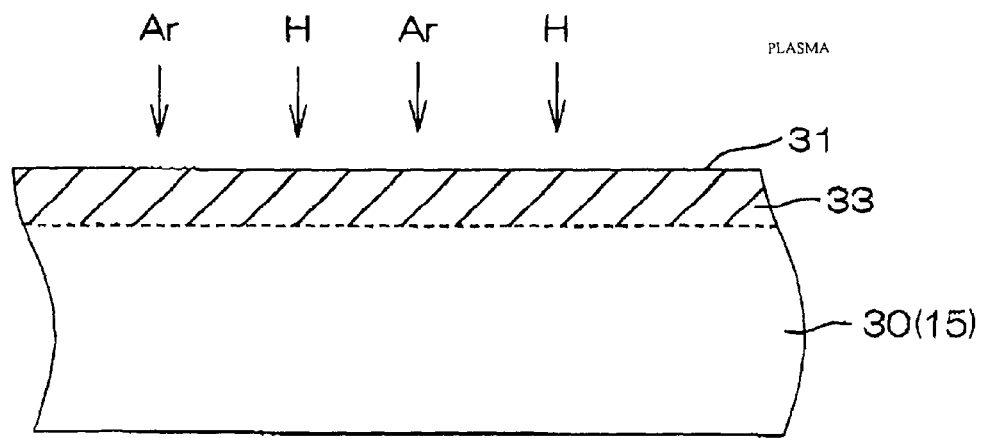
FIG. 6B is a graphic sectional view showing a pretreatment process of the forming method of the treatment layer and the DLC film.
Figure 6C:
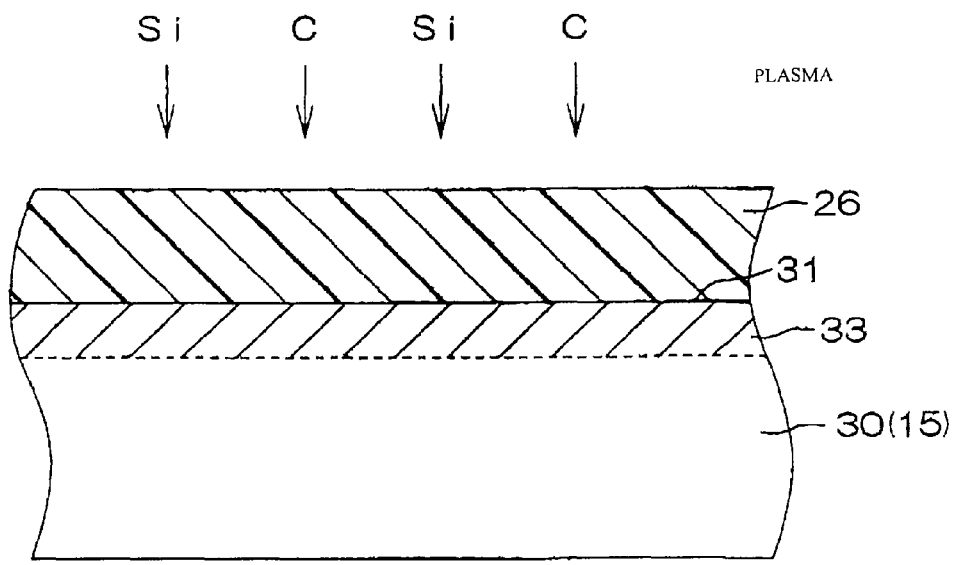
FIG. 6C is a graphic sectional view showing a DLC deposition process of the forming method of the treatment layer and the DLC film.

FIGS. 6A to C are graphic sectional views showing a forming method of the treatment layer 33 and the DLC film 26 in the process order. Hereinafter, a description will be given with reference to FIGS. 6A to C and FIG. 3. Hereinafter, the outer clutch plates 15 will be described as the substrate 30 that is an object to be treated. In this case, the surface of the substrate 30 is the first opposing surface 31 (see FIG. 6A).

First, the substrate 30 that is an object to be treated is brought into the treatment chamber 42, and placed on the support plate 38. Accordingly, the substrate 30 is retained by the base 43. After the substrate 30 is housed in the treatment chamber 42, the inside of the treatment chamber 42 is sealed. The treatment chamber 42 is sealed and the pressure inside the treatment chamber 42 is reduced. More specifically, the first regulating valve 52 is opened and only the first pump 53 is driven, so the inside of the treatment chamber 42 is roughly vacuumed. When a preset first predetermined period of time passes after the first pump 53 starts to be driven, the first regulating valve 52 is closed, and the second regulating valve 55 is opened, and the second pump 56 also starts to be driven. Also, the first pump 53 and the second pump 56 are driven for only a preset second predetermined period of time, such that the pressure inside the treatment chamber 42 decreases. After the second predetermined period of time passes, the second regulating valve 55 is closed, and the second pump 56 stops being driven.

In this example embodiment, a pretreatment process is executed on the surface of the substrate 30 before forming the DLC film 26 (the DLC deposition process) (see FIG. 6B).

After the pressure inside the treatment chamber 42 has decreased, the source gas introducing conduit 47 is opened and various source gases (hydrogen gas and argon gas) are introduced into the treatment chamber 42. The flowrates of the hydrogen gas and the argon gas are both 100 to 300 sccm. The flowrate of each source gas is regulated by a flow regulating valve (not shown). Also, the pressure inside of the treatment chamber 42 is reduced to a predetermined treatment pressure (for example, 100 Pa), and that reduced pressure state is maintained, by the opening amount being adjusted by the first regulating valve 52 while the first pump 53 is driven.

Next, negative direct-current pulse voltage of approximately 1000 V is applied to the base 43 while the reduced pressure state of 100 Pa, for example, inside the treatment chamber 42 is maintained. The frequency of this direct-current pulse voltage is equal to or greater than 200 Hz (for example, 1000 Hz), and the duty ratio is equal to or greater than 5% (for example, 50%). Accordingly, a potential difference of approximately 1000 V is generated between the base 43 (the substrate 30) and the partition wall 41 that is kept at ground potential, so plasma is generated inside the treatment chamber 42. As a result of this generation of plasma, the temperature of the surface (the first opposing surface 31) of the substrate 30 rises to approximately 200° C. The source gas inside the treatment chamber 42 is turned into a plasma by the plasma, and ions and radicals are produced and float inside the treatment chamber 42. Also, these ions and radicals are supplied to the surface of the substrate 30. Because a high voltage of 1000 V is applied to the base 43, these ions and radicals (for example, H ions and Ar ions) hit against the surface of the substrate 30 with great force. As a result, the surface of the substrate 30 is roughed appropriately, such that asperities are formed in the surface, and the surface of the substrate 30 is modified. When a preset treatment time (for example, 30 minutes) passes after the pulsed power supply 46 is turned on, the pulsed power supply 46 is turned off and discharging in the treatment chamber 42 ends.

Also, the H ions and radicals are floating around the surface of the substrate 30, so hydroxyl (OH—) appears on the surface of the substrate 30 following the generation of plasma inside the treatment chamber 42, but the H ions floating in the treatment chamber 42 trap the hydroxyl that appears from the surface of the substrate 30 by their reduction action. Therefore, the hydroxyl that appears from the surface of the substrate 30 can be prevented from adhering to the surface of the substrate 30. That is, impurities present on the surface of the substrate 30 can be removed by the H ions, and as a result, the surface of the substrate 30 can be cleaned. The treatment layer 33 is formed on the surface of the substrate 30 by these series of pretreatments.

Following the pretreatment process, the DLC film 26 is formed on the surface (the first opposing surface 31) of the substrate 30 (a DLC deposition process is executed), as shown in FIG. 6C.

After the pretreatment process ends, methane gas and TMS gas are introduced into the treatment chamber 42, and the flowrates of the hydrogen gas and the argon gas are adjusted. The flowrates of the methane gas, the hydrogen gas, the argon gas, and the TMS gas are 100 (sccm), 60 (sccm), 60 (sccm), and 6 (sccm), respectively.

Next, negative direct-current pulse voltage of approximately 1000 V is applied to the base 43 while the reduced pressure state of 100 Pa, for example, inside the treatment chamber 42 is maintained. The frequency of this direct-current pulse voltage is equal to or greater than 200 Hz (for example, 1000 Hz), and the duty ratio is equal to or greater than 5% (for example, 50%). Accordingly, a potential difference of approximately 1000 V is generated between the base 43 (the substrate 30) and the partition wall 41 that is kept at ground potential, so plasma is generated inside the treatment chamber 42. As a result, the temperature of the surface of the substrate 30 rises to approximately 200° C. The emission of plasma inside the treatment chamber 42 causes the methane gas and the TMS inside the treatment chamber 42 to turn into a plasma, such that ions and radicals are generated and float inside the treatment chamber 42. Also, DLC that contains Si is deposited on the surface of the substrate 30, such that a deposition layer is formed, by a chemical reaction that occurs inside the treatment chamber 42. As a result, the DLC film 26 is formed on the surface of the substrate 30 (the DLC deposition process).

When a preset treatment time (for example, 45 minutes) passes from the start of the supply of power from the pulsed power supply 46, the supply of power from the pulsed power supply 46 is stopped, and discharge inside the treatment chamber 42 ends. Also, after the temperature is decreased to normal temperature under decreased pressure, the substrate 30 is taken out of the treatment chamber 42. Accordingly, the DLC film 26 is formed on the first opposing surface 31 of the outer clutch plates 15.

Next, the example embodiment and comparative examples 1 to 3 will be described.

The DLC film 26 of the example embodiment was prepared on the surface of the substrate 30 made of a SKH4 substrate (25 mm×25 mm×5 mm, with an arithmetic average roughness Ra based on a stylus type surface roughness measurement of 0.004 μm), using the DLC forming method shown in FIGS. 6A to C. In order to prepare this DLC film 26, the pretreatment process shown in FIG. 6B and the DLC deposition process shown in FIG. 6C are executed in this order.

Also, the DLC films of comparative examples 1 to 3 were prepared on the surfaces of the substrates 30 made of SKH4 substrates (25 mm×25 mm×5 mm, with an arithmetic average roughness Ra based on a stylus type surface roughness measurement of 0.004 μm), using a DLC forming method similar to that shown in FIGS. 6A to C. The formation of the DLC film 26 of the example embodiment and the formation of the DLC films of comparative examples 1 to 3 use different in treatment gas species and treatment pressures in the pretreatment process. The treatment conditions of the pretreatment in the example embodiment and comparative examples 1 to 3 are shown in Table 1. Also, the pretreatment process and the DLC deposition process with the example embodiment and comparative examples 1 to 3 are executed using the treatment system 40 shown in FIG. 4. A system with a treatment region (a region that can be effectively treated) inside the treatment chamber 42 of φ 300 mm and a height of 300 mm is used as the treatment system 40. Also, a mirror-like finishing from polishing is given to the surfaces of the substrate 30 used in the example embodiment and the substrates used in comparative examples 1 to 3.

TABLE 1

|  | Surface roughness | | SPM surface roughness | | Treatment conditions of pretreatment | | | |
| --- | --- | --- | --- | --- | --- | --- | --- | --- |
|  | Ra (μm) | Rz (μm) | Ra (nm) | Rz (nm) | Treatment pressure (Pa) | Treatment gas | Power supply | Adhesion (N) |
| Comparative example 1 | 0.015 | 0.14 | 11.4 | 101 | 200 | Ar | Pulse | Approximately 14 |
| Example embodiment | 0.01 | 0.1 | 7 | 121 | 200 | Ar + H | Pulse | 25.9 |
| Comparative example 3 | 0.03 | 0.168 | 10 | 243 | 50 | Ar + H | Pulse | 20.0 |

In this example embodiment, in the pretreatment process shown in FIG. 6B, a case is shown in which the atmosphere inside the treatment chamber 42 contains both argon gas and hydrogen gas. The flow ratio of argon gas and hydrogen gas supplied into the treatment chamber 42 is 1:1. As the conditions of the pretreatment, the voltage value of the direct-current pulse voltage is 1000 V (negative), the pulse frequency of the direct-current pulse voltage is 1000 (Hz), and the duty ratio of the direct-current pulse voltage is 30%. Also, the treatment pressure in the pretreatment process is 200 (Pa).

Comparative example 1 differs from the example embodiment in that, in the pretreatment process shown in FIG. 6B, the atmosphere inside the treatment chamber 42 does not contain hydrogen gas, but contains only argon gas. Also, comparative example 2 differs from the example embodiment in that, in the pretreatment process shown in FIG. 6B, the atmosphere inside the treatment chamber 42 does not contain argon gas, but contains only hydrogen gas. In comparative example 1 and comparative example 2, the treatment pressure in the pretreatment process, the voltage value, the duty ratio, and the frequency of the direct-current pulse voltage in the pretreatment process, and the treatment time of the pretreatment, are the same as they are in the example embodiment.

Comparative example 3 differs from the example embodiment in that the treatment pressure in the pretreatment process is 50 (Pa), not 200 (Pa). In comparative example 3, the flow ratio of the treatment gas in the pretreatment process, the voltage value, the duty ratio, and the frequency of the direct-current pulse voltage in the pretreatment process, and the treatment time of the pretreatment, are the same as they are in the example embodiment.

Figure 7:
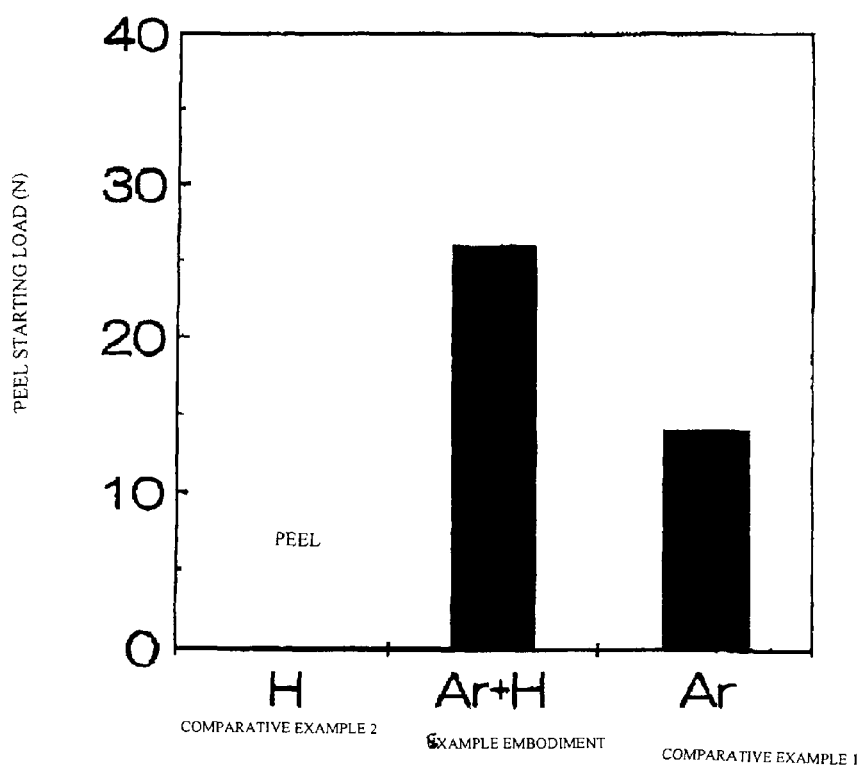
FIG. 7 is a graph showing a peel starting load of a DLC film of the example embodiment and DLC films of comparative examples 1 and 2.

A peel test was performed on the DLC film 26 of the example embodiment and the DLC films of comparative examples 1 to 3. The results when the peel test was performed on the DLC film 26 and the DLC films of comparative examples 1 and 2 are shown in FIG. 7 and Table 1. Also, the results when the peel test was performed on the DLC film of comparative example 3 are shown in Table 1.

The peel starting load ("adhesion" shown in Table 1) of the DLC film 26 of this example embodiment is approximately 14 N. The peel starting load of the DLC film of comparative example 1 is 25.7 N, while the DLC film of comparative example 2 is peeled off immediately after the start of the test, so the peel starting load was unable to be measured. As a result, it is evident that the adhesiveness between the substrate 30 and the DLC film 26 is good with the example embodiment.

Next, the surface roughness of the DLC film 26 of the example embodiment and the surface roughness of comparative examples 1 to 3 will be described.

Figure 8:
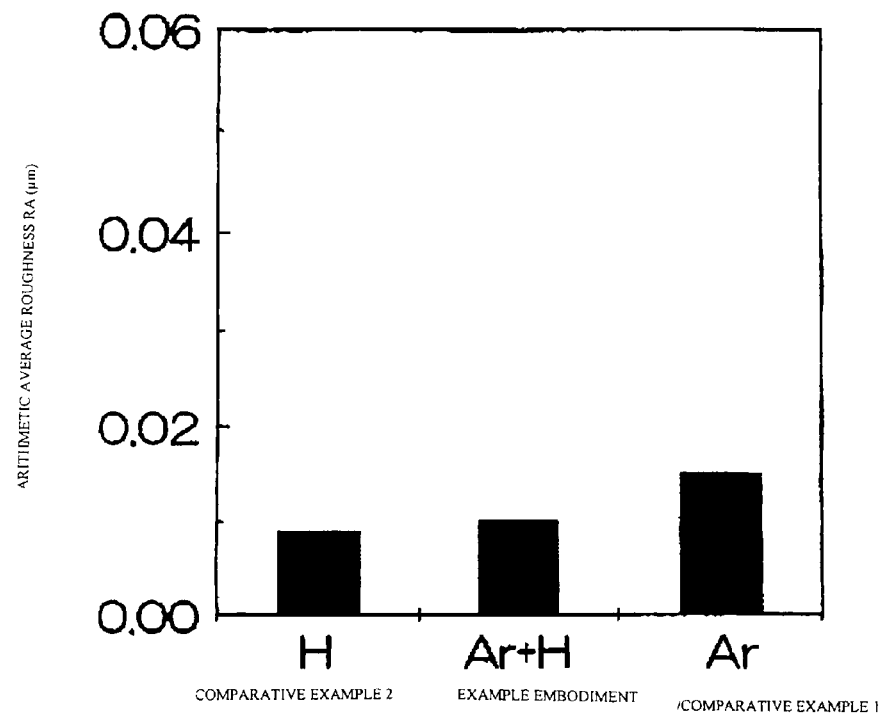
FIG. 8 is a graph showing an arithmetic average roughness based on a stylus type surface roughness measurement of the DLC film of the example embodiment and the DLC films of comparative examples 1 and 2.

The surface roughness of the DLC film 26 of the example embodiment and the surface roughness of comparative examples 1 and 3 were each measured by both a stylus type surface roughness measurement and a surface roughness measurement according to SPM. The measurement results are shown in Table 1. Also, the arithmetic average roughness Ra based on the stylus type surface roughness measurement of the DLC film of comparative example 2 was measured. The arithmetic average roughness Ra based on the stylus type surface roughness measurement of the DLC film 26 of the example embodiment and the DLC films of comparative examples 1 and 2 are shown in FIG. 8.

In the example embodiment, the arithmetic average roughness Ra based on the stylus type surface roughness measurement is 0.01 μm, and a ten point height of irregularities RzJIS based on the stylus type surface roughness measurement is 0.1 μm. On the other hand, the arithmetic average roughness Ra based on the stylus type surface roughness measurement of comparative examples 1 to 3 all exceed 0.01 μm. Also, the ten point height of irregularities RzJIS based on the stylus type surface roughness measurement of comparative examples 1 and 3 exceed 0.1 μm.

Also, in the example embodiment, the arithmetic average roughness Ra based on the surface roughness measurement according to SPM is 7 nm, and the ten point height of irregularities RzJIS based on the surface roughness measurement according to SPM is 121 nm. On the other hand, the arithmetic average roughness Ra based on the surface roughness measurement according to SPM of comparative examples 1 and 3 is 11.4 nm and 10.0 nm, respectively. Also, the ten point height of irregularities RzJIS based on the surface roughness measurement according to SPM of comparative examples 1 and 3 is 101 nm and 243 nm, respectively. That is, with the example embodiment, the arithmetic average roughness Ra based on the surface roughness measurement according to SPM was equal to or less than 10 nm, and the ten point height of irregularities RzJIS based on the surface roughness measurement according to SPM was equal to or less than 150 nm, but with comparative example 1, the arithmetic average roughness Ra based on the surface roughness measurement according to SPM exceeds 10 nm, and with comparative example 3, the ten point height of irregularities RzJIS based on the surface roughness measurement according to SPM exceeds 150 nm.

Also, from the measurement results above, among the DLC film 26 of the example embodiment and the DLC films of the comparative examples 1 and 3, it is evident that the surface of the DLC film 26 of the example embodiment is the smoothest. Also, comprehensively taking the four values of surface roughness of the surface roughness of the DLC films into account, it is evident that the surface of the DLC film of comparative example 3 is rougher than the surface of the DLC film of comparative example 1.

Next, the surface roughness of the DLC film 26 of the example embodiment and the friction and abrasion characteristics of the DLC films of the comparative examples 1 to 3 will be described.

A friction and abrasion test was performed on the DLC film 26 of the example embodiment and the DLC films of comparative example 1 and comparative example 3. A ball-on-plate reciprocating friction coefficient test machine was used as the test equipment. With this ball-on-plate reciprocating friction coefficient test machine, a steel ball (a bearing steel ball; for example, SUJ2) of φ 4.8 mm, for example, was used for the other material. Also, each of the substrates described above (the substrate 30 on which the DLC film 26 of the example embodiment is formed, and the substrates on which the DLC films of comparative example 1 and comparative example 3 are formed) were set as test pieces, and a friction and abrasion test was performed for 60 minutes (3600 sec) with no lubrication under test conditions of a speed of 2 Hz, a stroke of 10 mm, and a load of 10 N. During the friction and abrasion test, the coefficient of friction was measured at a ratio of once each 1 sec. The relationship between the friction time and the slide time (the elapsed time from the start of the test) in the friction and abrasion test is shown in FIG. 9.

Figure 9:
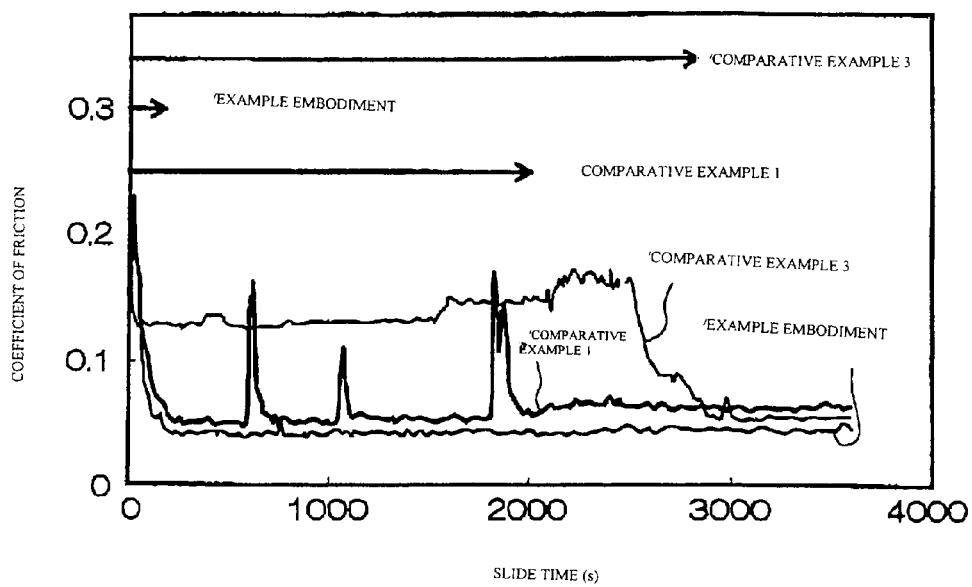
FIG. 9 is a graph showing the relationship between friction time and elapsed time from the start of a test in a friction and abrasion test.

As shown in FIG. 9, the example embodiment and comparative examples 1 and 3 ultimately displayed low values of 0.04 to 0.05 for the coefficient of friction, but displayed different behaviors in the process up until those low values. In FIG. 9, the period of time until the coefficient of friction reaches a predetermined low value (0.04 to 0.05) and remains steady at that low value, i.e., the period of time from the start of the test until the DLC film is compatible with the other material (hereinafter simply referred to as the "time until compatible"), is shown by an arrow.

More specifically, in the example embodiment, the coefficient of friction decreased at the beginning of the friction and abrasion test, and the coefficient of friction then remained a low stable value until the end of the test. The time until compatible of the example embodiment is approximately 220 sec.

With comparative example 1, the coefficient of friction decreased rapidly at the beginning of friction, but then a large fluctuation in the coefficient of friction was recognized at random times. The time until compatible of comparative example 1 is approximately 2000 sec. On the other hand, with comparative example 3, the coefficient of friction indicated a high value of 0.14 at the beginning of friction, and then stopped at a high value for an extended period of time. The time until compatible of comparative example 3 is approximately 2850 sec.

Figure 10:
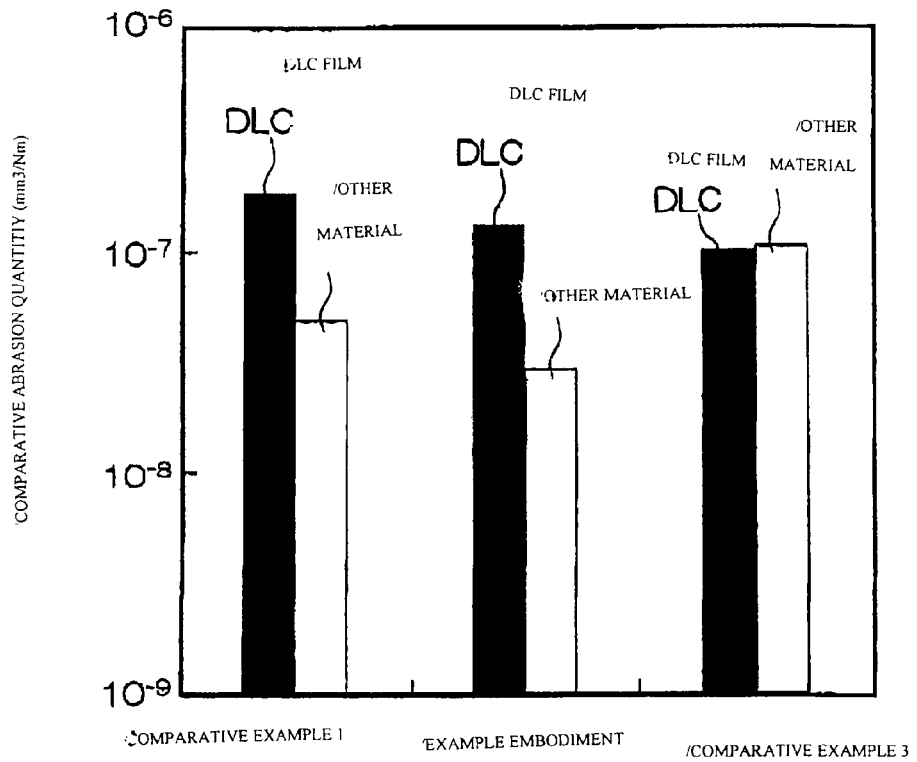
FIG. 10 is a graph showing the comparative abrasion quantity of the DLC film and the comparative abrasion quantities of other materials after the friction and abrasion test.

Also, the comparative abrasion quantity of each DLC film and the comparative abrasion quantities of the other materials after the friction and abrasion test were obtained. These comparative abrasion quantities are shown in FIG. 10. The comparative abrasion quantity of each DLC film was calculated by the sectional area of abrasion marks, and the comparative abrasion quantities of the other materials were calculated by the abrasion trace size.

There is almost no difference between the comparative abrasion quantity of the DLC film 26 of the example embodiment, and the comparative abrasion quantities of the DLC films of comparative examples 1 and 3. On the other hand, a difference is recognized in the comparative abrasion quantities of the other materials. The comparative abrasion quantity of the other material corresponding to the example embodiment is approximately $1.8 \times 10^{-8}$ mm$^3$/Nm. In contrast, the comparative abrasion quantity of the other material corresponding to comparative example 1 is approximately $4.6 \times 10^{-8}$ mm$^3$/Nm, and the comparative abrasion quantity of the other material corresponding to comparative example 3 is approximately $1.1 \times 10^{-7}$ mm$^3$/Nm. That is, the comparative abrasion quantity of the other material is the largest with comparative example 3, and the smallest with the example embodiment. As described above, among the DLC film 26 of the example embodiment and the DLC films of comparative examples 1 and 3, the surface of the DLC film 26 is considered to be the smoothest, so in other words, it can be said that the comparative abrasion quantity of the other material decreases as the surface of the DLC film 26 becomes finer.

Therefore, from FIGS. 8 to 10 and Table 1, it can be understood that the surface state of the compatibility layer 33 that is formed by the pretreatment influences the compatibility process at the beginning of friction.

Figure 11:
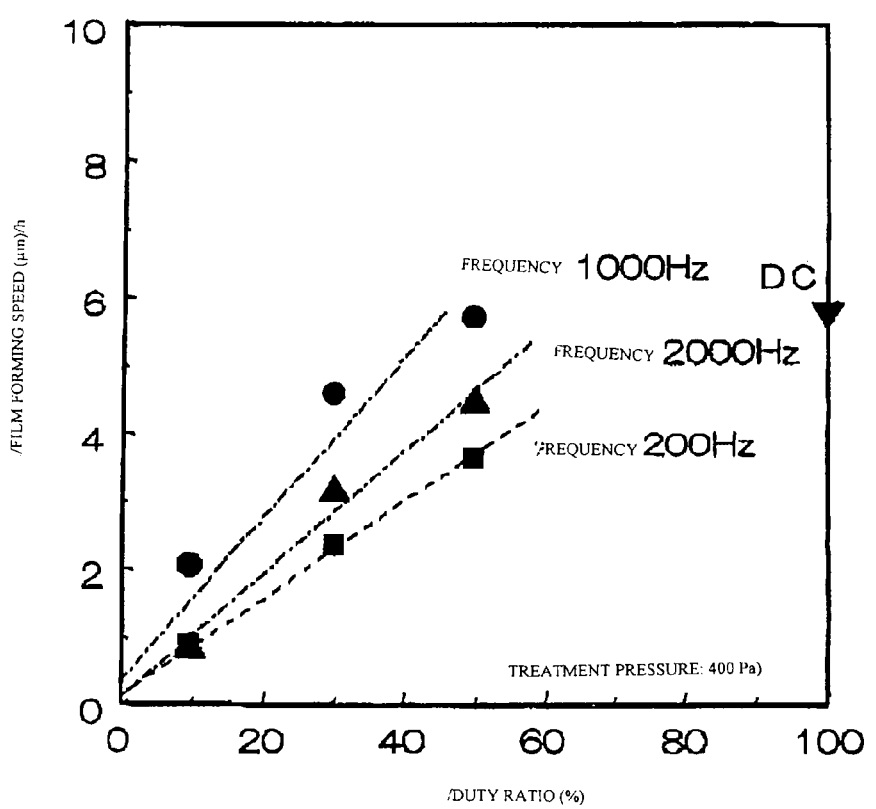
FIG. 11 is a graph showing the relationship between the duty ratio of direct-current pulse voltage and the film forming speed of the DLC film during film formation.

FIG. 11 is a graph showing the relationship between the film forming speed of the DLC film 26, and the duty (Duty) of the direct-current pulse voltage during film formation. FIG. 11 shows a case in which the treatment pressure inside the treatment chamber 42 is 400 Pa, and the voltage of the pulsed power supply 46 is –1000 V. The solid black circle in FIG. 11 shows the relationship between the duty ratio and the film forming speed when the frequency of the direct-current pulse voltage is 1000 Hz, the solid black triangle in FIG. 11 shows the relationship between the duty ratio and the film forming speed when the frequency of the direct-current pulse voltage is 2000 Hz, and the solid black square in FIG. 11 shows the relationship between the duty ratio and the film forming speed when the frequency of the direct-current pulse voltage is 200 Hz. The inverted solid black triangle is the film forming speed (5.8 μm/h) when forming the DLC film by the conventional direct current plasma CVD method, under a condition of a treatment temperature of 400 Pa.

From the results shown in FIG. 11, it is evident that the film forming speed increases as the duty ratio of the direct-current pulse voltage increases, when the frequency of the direct-current pulse voltage is 2000 Hz, 1000 Hz, and 200 Hz. Also, from the results shown in FIG. 11, it is evident that the film forming speed is higher when the frequency of the direct-current pulse voltage is 2000 Hz and 1000 Hz, than when the frequency of the direct-current pulse voltage is 200 Hz, regardless of the duty ratio of the direct-current pulse voltage.

More specifically, when the frequency of the direct-current pulse voltage is 2000 Hz, it is 3.1 μm/h when the duty ratio is 30%, and it is 4.5 μm/h when the duty ratio is 50%. Also, when the frequency of the direct-current pulse voltage is 1000 Hz, it is 4.6 μm/h when the duty ratio is 30%, and it is 5.7 μm/h when the duty ratio is 50%. In particular, when the frequency of the direct-current pulse voltage is 1000 Hz and the duty ratio is 50%, there is almost no difference from the film forming speed (5.8 μm/h) when forming a film by the conventional direct current plasma CVD method.

Figure 12:
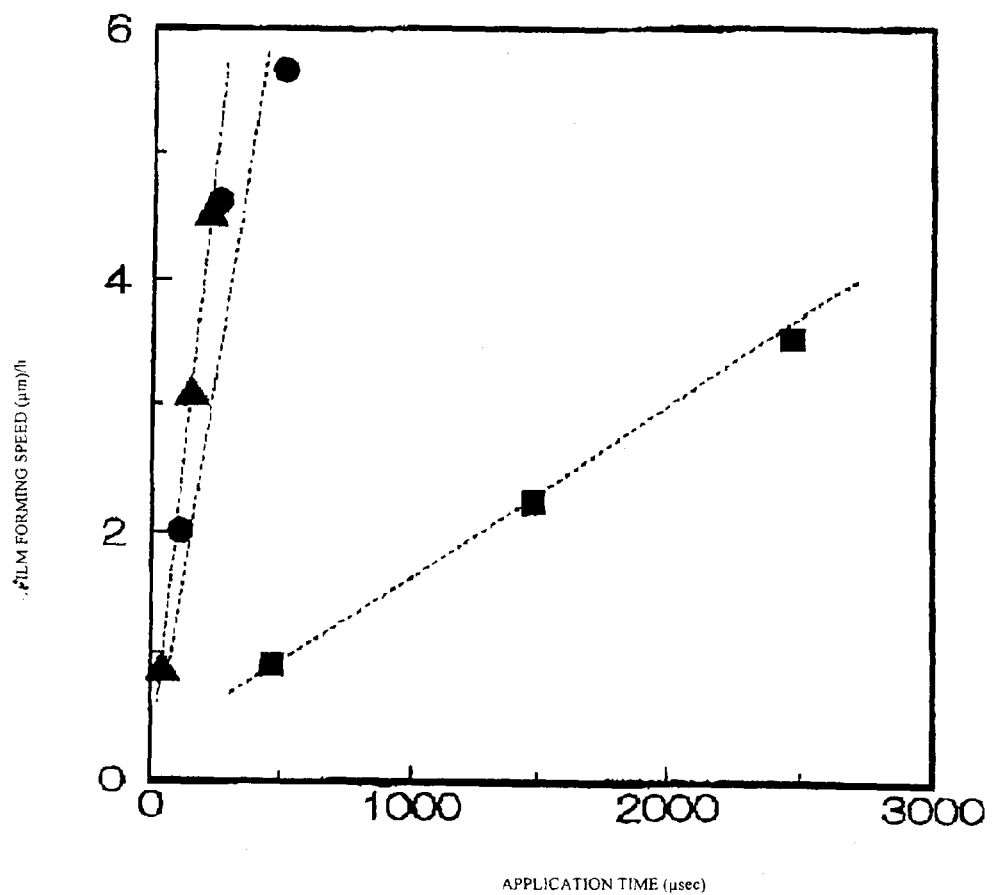
FIG. 12 is a graph showing the relationship between treatment pressure and the film forming speed of the DLC film during film formation.

FIG. 12 is a graph showing the relationship between the film forming speed of the DLC film and the application time (t) of direct-current pulse voltage during film formation. FIG. 12 shows a case in which the treatment pressure inside the treatment chamber 42 is 400 Pa, and the voltage of the pulsed power supply 46 is –1000 V. The solid black triangle in FIG. 12 shows the relationship between the application time and the film forming speed when the frequency of the direct-current pulse voltage is 2000 Hz, the solid black circle in FIG. 12 shows the relationship between the application time and the film forming speed when the frequency of the direct-current pulse voltage is 1000 Hz, and the solid black square in FIG. 12 shows the relationship between the application time and the film forming speed when the frequency of the direct-current pulse voltage is 200 Hz. The relationship between the film forming speed of each DLC film and the application times of the DLC films can be expressed by a linear approximate equation as shown in FIG. 12, based on each plot. Straight line graphs corresponding to these linear approximate equations are shown in FIG. 12. As shown in FIG. 12, the constant of the linear approximate equation when the frequency is 1000 Hz and when the frequency is 2000 Hz is remarkably larger than the constant of the linear approximate equation when the frequency is 200 Hz (the slope of the straight line graph shown in FIG. 12 is greater).

Also, the film forming speed when the frequency is 1000 Hz and the application time of the direct-current pulse voltage is 500 μsec (that is, a duty ratio of 50%) is 5.8 μm/h, so there is almost no difference from the film forming speed (5.8 μm/h) when forming a film by the conventional direct current plasma CVD method.

The test result (the solid black triangle plot) of the film forming speed reaching the film forming speed (5.8 μm/h) when the film is formed by the conventional direct current plasma CVD method, in the case where the frequency is 2000 Hz, is not shown in FIG. 12. However, from the straight line graph corresponding to the linear approximate equation based on the solid black triangle plot in FIG. 12, if the application time of the direct-current pulse voltage exceeds approximately 300 μsec (that is, if the duty ratio exceeds 60%), it can be inferred that the film forming speed is one that reaches the film forming speed (5.8 μm/h) when the film is formed by the conventional direct current plasma CVD method.

Therefore, from FIG. 11 and FIG. 12, it is evident that the film forming speed of the DLC film is large when the frequency of the direct-current pulse voltage is equal to or greater than 1000 Hz. Also, in this case, it is evident that the film forming speed of the DLC film is even greater when the duty ratio is equal to or greater than 30%.

Figure 13:
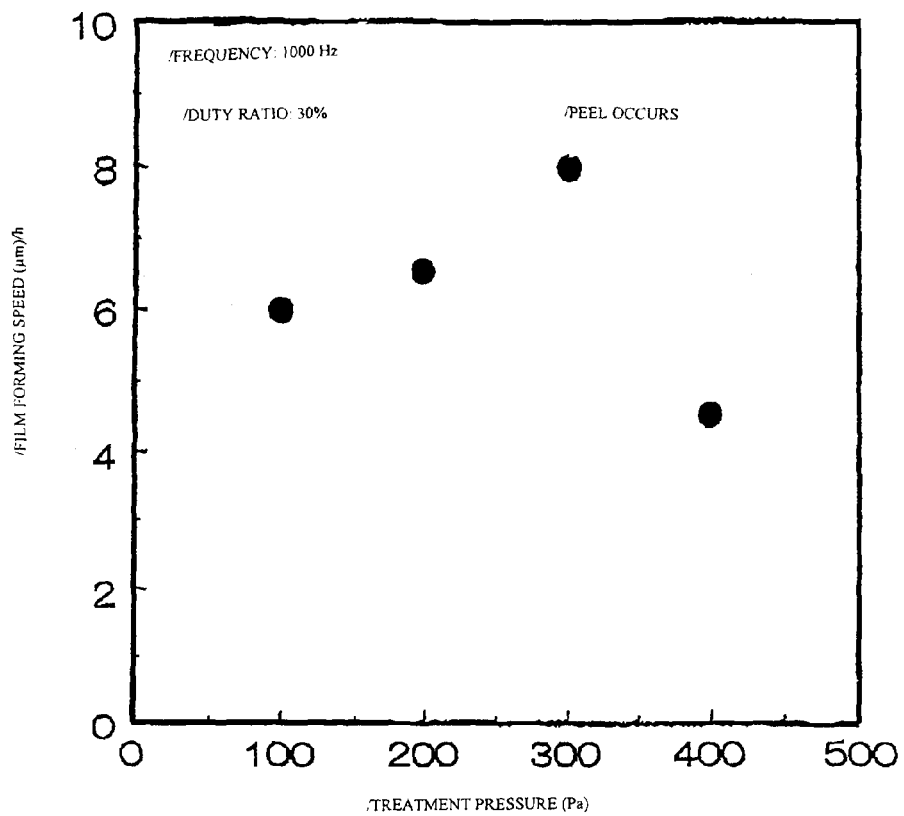
FIG. 13 is a graph showing the relationship between the application time of the direct-current pulse voltage and the film forming speed of the DLC film during film formation.

FIG. 13 is a graph showing the relationship between the treatment pressure and the film forming speed of the DLC film. FIG. 13 shows a case in which the voltage of the pulsed power supply 46 is –1000 V, the frequency of the direct-current pulse voltage is 1000 Hz, and the duty ratio is 30%.

When the treatment pressure is 100 Pa and 200 Pa, the film forming speed indicates a relative high value of approximately 6 μm and approximately 7 μm, respectively. Also, when the treatment pressure is increased to 300 Pa, the film forming speed indicates an even higher value, but peel occurred when the friction and abrasion test described above was performed. Moreover, when the treatment pressure is increased to 400 Pa, the film forming speed decreased to equal to or less than 5 μm. When the treatment pressure is 100 Pa, 200 Pa, or 400 Pa, peel did not occur when the friction and abrasion test described above was performed. It is thought that peel occurred due to low adhesion of the DLC film to the substrate. From the results shown in FIG. 13, when the treatment pressure is equal to or less than 200 Pa, the film forming speed becomes relatively high, and adhesion of the DLC film 26 to the substrate 30 after film formation is also considered to be good.

Next, a second example embodiment of the present invention will be described. This second example embodiment differs from the first example embodiment in that the process of the pretreatment is not a single process, but is divided into two processes of a first half and a second half. Hereinafter, these will be described in detail.

Figure 14:
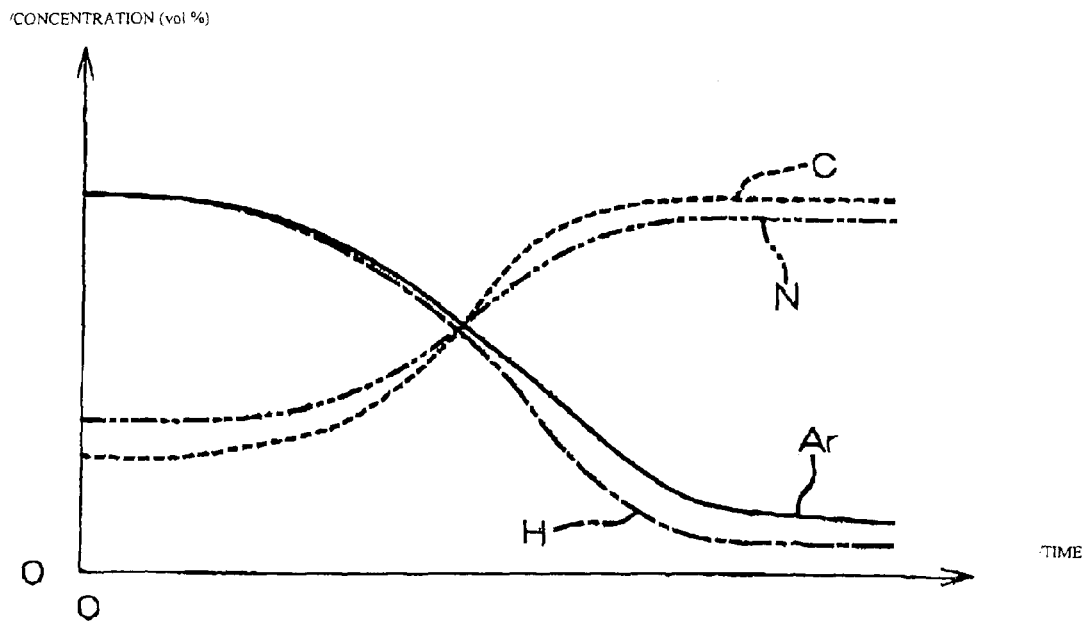
FIG. 14 is a graph showing the change over time in the ion and radical concentrations in the treatment chamber in a pretreatment process of a second example embodiment of the present invention.

Also, in the pretreatment process according to this second example embodiment, when a predetermined treatment time (for example, 10 minutes) passes after gas has started to be supplied, the flowrates of the gases introduced into the treatment chamber 42 are switched. FIG. 14 is a graph showing the change over time in the ion and radical concentrations inside the treatment chamber 42 in the pretreatment process. The horizontal axis in FIG. 14 represents the treatment time (elapsed time) from the start of the pretreatment process, and the vertical axis in FIG. 14 represents the respective concentrations (vol %) of ions and radical in the treatment chamber 42.

In the first half of the pretreatment process (the first process; for example, until 10 minutes after the start of the treatment from immediately after the treatment starts), the argon gas and the hydrogen gas introduced into the treatment chamber 42 have relatively large flowrates (the argon gas is 100 to 150 sccm, and the hydrogen gas is 100 to 150 sccm), and the methane gas and nitrogen gas introduced into the treatment chamber 42 have relatively small flowrates (the methane gas is 30 to 50 sccm, and the nitrogen gas is 30 to 50 sccm). Therefore, in the first half (the first process) of the pretreatment process, the argon gas and the hydrogen gas in the atmosphere inside the treatment chamber 42 are at relatively high concentrations, and the concentrations of the methane gas and the nitrogen gas inside the treatment chamber 42 are relatively low concentrations. Therefore, in the first half (the first process) of the pretreatment process, mainly Ar ions and radicals and H ions and radicals are present in the atmosphere inside the treatment chamber 42, as shown in FIG. 14. Also, these Ar ions and radicals and H ions and radicals hit against the surface of the substrate 30 with extremely strong force. The surface of the substrate 30 is roughed, such that asperities are formed on the surface of the substrate 30, by the Ar ions and radicals that have a large specific gravity hitting against the surface of the substrate 30. As a result, the adhesiveness of the DLC film 26 formed on the surface of the substrate 30 becomes better.

Also, in the pretreatment, H ions and radicals are floating around the surface of the substrate 30. Hydroxyl (OH—) appears on the surface of the substrate 30 following the generation of plasma inside the treatment chamber 42, but the ions that are floating inside the treatment chamber 42 trap the hydroxyl that appears from the surface of the substrate 30 by their reducing action. Therefore, the hydroxyl that appears from the surface of the substrate 30 can be prevented from adhering to the surface of the substrate 30. That is, impurities present on the surface of the substrate 30 can be removed by the H ions, so the surface of the substrate 30 can be cleaned.

Meanwhile, in the second half (the second process; from 10 minutes after the treatment starts until 30 minutes after the treatment starts) of the pretreatment process, the methane gas and the nitrogen gas introduced into the treatment chamber 42 have relatively large flowrates (the methane gas is 100 to 150 sccm, and the nitrogen gas is 100 to 150 sccm, and the argon gas and hydrogen gas introduced into the treatment chamber 42 have relatively small flowrates (the argon gas is 30 to 50 sccm, and the hydrogen gas is 30 to 50 sccm). Therefore, in the second half (the second process) of the pretreatment process, the methane gas and the nitrogen gas contained in the atmosphere inside the treatment chamber 42 are at relatively high concentrations, and the concentrations of the argon gas and the hydrogen gas inside the treatment chamber 42 are relatively low concentrations.

That is, as shown in FIG. 14, in the first half (the first process) of the pretreatment process, the number of Ar ions and radicals and H ions and radicals in the atmosphere inside the treatment chamber 42 is relatively large compared with the number of C ions and radicals and N ions and radicals. Also, with the shift from the first half of the pretreatment process to the second half (the second process) of the pretreatment process, the number of Ar ions and radicals and H ions and radicals in the atmosphere inside the treatment chamber 42 gradually falls, while the number of C ions and radicals and N ions and radicals in the atmosphere inside the treatment chamber 42 gradually rises. As a result, in the second half of the pretreatment process, the number of C ions and radicals and N ions and radicals in the atmosphere inside the treatment chamber 42 becomes larger than the number of Ar ions and radicals and H ions and radicals.

Therefore, in the second half of the pretreatment process, mainly C ions and radicals and N ions and radicals are present in the atmosphere inside the treatment chamber 42, and these C ions and radicals and N ions and radicals are floating around the surface of the substrate 30. The treatment layer 33 is formed on the surface of the substrate 30 by these series of pretreatments.

Also, in the second half (the second process) of the pretreatment process, the C ions and radicals are floating around the surface of the substrate 30, so the treatment layer 33 contains C. As a result, the adhesiveness between the substrate 30 and the DLC film 26 after formation of the DLC film 26 can be improved even more.

Also, in the second half of the pretreatment process, N ions and radicals are floating around the surface of the substrate 30, so the nitrided layer is formed on the surface of the substrate 30. As a result, the surface hardness of the surface of the substrate 30 can be improved.

Above, the two example embodiments of the present invention were described, but the present invention may also be carried out in other modes.

In the example embodiments described above, a case in which the first pump (a low-vacuum pump) 53 and the second pump (a high-vacuum pump) 56 are used together to create a reduced pressure state inside the treatment chamber 42 was given as an example, but the reduced pressure state may also be generated inside the treatment chamber 42 using only the first pump 53. That is, the present invention may be carried out with only the first pump 53.

Also, a structure that kept the voltage value of the direct-current pulse voltage constant (for example, 1000 V) during the treatment period of the pretreatment process was described, but a structure that changes the voltage midway is also possible. More specifically, in the overall period (the 30 minutes of treatment time) of the pretreatment, for an initial predetermined period (the first five minutes), the voltage value (the absolute value of the voltage) of the direct-current pulse voltage may be set to a relatively low voltage value (for example, 500 V (negative)), and after that predetermined period has passed, the voltage value (the absolute value of the voltage) of the direct-current pulse voltage may be set to a relatively high voltage value (for example, 1000 V to 3000 V (negative)).

Also, methane gas was given as an example of hydrocarbon gas, but instead of this methane gas, another gas such as acetylene gas, benzene, or toluene or the like may of course be used.

Also, a structure in which the DLC film 26 was formed on the first opposing surface 31 of the outer clutch plates 15 was described, but the structure may also be one in which the DLC film 26 is formed on the surface of the inner clutch plate 16.

Also, in the example embodiments described above, a case in which the DLC film 26 is formed on the surface of one of the clutch plates 15, 16 of the friction clutch 11 was given as an example, but the DLC film 26 may also be formed on a tooth flank of a worm of a steering system, a retainer or raceway surface of inner and outer rings of a bearing, and a surface of a male spline portion and/or a female spline portion of a propeller shaft (drive shaft).

Also, a structure containing Si was given as an example of the DLC film 26, but the DLC film 26 may also contain another metal (such as Cr, Ti, or Fe, for example), or the DLC film 26 may be a structure that does not contain any metal at all.

Also, carbon steel (S50C) or stainless steel may also be used instead of tool steel, as the material of the slide member on which the DLC film 26 is formed.

In addition, various design modifications are also possible within the scope of the points described in the scope of claims.

A DLC film-forming method of the present invention is method for forming, inside a treatment chamber, a DLC film that covers at least a portion of a surface of a substrate, the DLC film-forming method including a pretreatment process that is executed in a reduced pressure state of a predetermined treatment pressure generated by a low-vacuum pump, and that supplies Ar ions and H ions to the surface of the substrate by applying direct-current pulse voltage to the substrate, and generating plasma in an atmosphere that includes argon gas and hydrogen-based gas inside the treatment chamber; and a DLC deposition process that is executed after the pretreatment process in the reduced pressure state, and that forms a deposition layer of DLC on the surface of the substrate after the pretreatment process is executed, by applying direct-current pulse voltage to the substrate, and generating plasma in an atmosphere inside the treatment chamber. In the pretreatment process and the DLC deposition process, a treatment time of both of the processes, the predetermined treatment pressure in both of the processes, or a frequency, duty ratio, or voltage value of the direct-current pulse voltage applied to the substrate in both of the processes, is set such that a temperature of the substrate becomes equal to or less than 300° C.

According to the method of the present invention, pulse voltage is applied to the substrate in the DLC deposition process. With the pulsed direct-current voltage, voltage application is discontinuous, so even if the applied voltage (negative) is set high (to approximately 1000 V, for example) in order to generate plasma, abnormal discharge will not easily occur inside the treatment chamber, so the temperature will not easily rise. Therefore, by adjusting the treatment pressure inside the treatment chamber, or the frequency, the duty ratio or the voltage value of the direct-current pulse voltage, the treatment temperature can be maintained at a low temperature (for example, equal to or less than 300° C.) without using a cooling system for reducing the treatment temperature. The DLC film is formed in a low-temperature environment, so even if the substrate does not have sufficient heat resistance, the DLC film is able to be formed without damaging the substrate. Thus, the selection range of substrate materials on which the DLC film should be deposited can be broadened.

Also, if the pressure inside the treatment chamber is reduced excessively, there will be almost no molecules of the source gas present inside the treatment chamber, so the film forming speed of the DLC film may be decreased. However, the pressure inside the treatment chamber is reduced using a low-vacuum pump such as an oil-sealed rotary vacuum pump, so the pressure inside the treatment chamber will not be reduced to an extremely low pressure state (for example, equal to or less than 10 Pa).

Also, Ar ions and H ions are supplied to the surface of the substrate before the DLC deposition process. At this time, Ar ions that have a large specific gravity hit against the surface of the substrate. As a result, the surface of the substrate is appropriately roughed, and the DLC film is deposited on that surface of the substrate. Therefore, adhesiveness of the DLC film formed on the surface of the substrate becomes better.

Meanwhile, the H ions supplied to the surface of the substrate clean the surface of the substrate by their reducing action. Described in more detail, hydroxyl appears on the surface of the substrate as a result of the surface of the substrate being roughed. This hydroxyl is a so-called impurity, and is thus the cause of contamination of the substrate surface if it adheres to the surface of the substrate. However, the hydroxyl that appears on the surface of the substrate bonds with the H ions supplied to the surface of the substrate, and is thus removed from the surface of the substrate. As a result, the surface of the substrate, i.e., the boundary surface with the deposition layer of DLC on the substrate is cleaned. Therefore, adhesiveness of the DLC film can be even further improved.

Also, the surface of the DLC film formed by this method is smooth. Thus, the initial friction is low, and the initial compatibility is excellent.

Further, in both the pretreatment process and the DLC deposition process, plasma generated by a direct-current pulse is used. Therefore, the pretreatment process and the DLC deposition process can be executed using a common treatment system (40). In this case, two processes, i.e., the pretreatment process and the DLC deposition process, can be executed without transferring the substrate, and as a result, the time required for these two processes can be shortened.

Also, when the atmosphere also contains carbon gas and/or nitrogen gas, C ions and/or the N ions are supplied to the surface of the substrate. Having C ions be supplied to the surface of the substrate results in carbon being contained in a layer that is included in the surface of the substrate. As a result, the adhesiveness between the substrate and the DLC film after formation of the DLC film can be even further improved. Also, having N ions be supplied to the surface of the substrate results in a nitrided layer being formed on the surface of the substrate. As a result, the surface hardness of the substrate improves.

Also, if the treatment pressure exceeds 200 Pa, plasma will become unstable in a low-temperature environment, so the DLC film after film formation may peel or the film forming rate of the DLC film may decrease. Having the treatment pressure in the DLC deposition process be equal to or less than 200 Pa makes it possible to stabilize the plasma even in a low-temperature environment. As a result, the DLC film is able to be formed on the surface of the substrate at a good film forming rate.

If the frequency of the direct-current pulse voltage applied to the substrate in the DLC deposition process is set to equal to or greater than 1000 Hz, a relatively high film forming rate is able to be realized even if the treatment pressure is a relatively low pressure (for example, equal to or less than 200 Pa). As a result, the DLC film is able to be formed on the surface of the substrate at a good film forming rate in a low-temperature environment.

If the frequency of the direct-current pulse voltage is set to equal to or greater than 1000 Hz, the duty ratio of the direct-current pulse voltage is preferably set to equal to or greater than 30% (and more preferably, equal to or greater than 50%). In this case, a film forming rate similar to the film forming rate when forming the DLC film by the conventional direct current plasma CVD method can be realized. As a result, the DLC film is able to be formed on the surface of the substrate at a good film forming rate in a low-temperature environment.

In the pretreatment process, when the atmosphere inside the treatment chamber contains carbon-based gas and nitrogen-based gas, and the pretreatment process is divided into a first process in which argon gas and hydrogen-based gas contained in the atmosphere are at higher concentrations than the carbon-based gas and the nitrogen-based gas, and a second process that is executed following the first process, and in which the carbon-based gas and the nitrogen-based gas contained in the atmosphere are at higher concentrations than the argon gas and the hydrogen-based gas, in the first process of the pretreatment process, the argon gas and the hydrogen-based gas contained in the atmosphere are at higher concentrations than the carbon-based gas and the nitrogen-based gas. Therefore, relatively large amounts of Ar ions and H ions are present in the atmosphere near the surface of the substrate, and these Ar ions and H ions are supplied to the surface of the substrate. Also, in this first process, supplying the Ar ions to the surface of the substrate results in better adhesiveness of the DLC film formed on the surface of the substrate, and when H ions are supplied to the surface of the substrate, the surface of the substrate is cleaned by their reducing action, so the adhesiveness of the DLC film improves.

Also, in the second process that is executed following the first process, the carbon-based gas and the nitrogen-based gas contained in the atmosphere are at higher concentrations than the argon gas and the hydrogen-based gas. Therefore, there is a larger amount of N ions present than Ar ions and H ions, in the atmosphere near the surface of the substrate. Therefore, a nitrided layer is formed on the surface of the substrate after the first process (supplying Ar ions and H ions to the surface of the substrate). As a result, the adhesiveness of the DLC film can be improved, and the surface hardness of the substrate can be improved.

Also, when forming the DLC film using the DLC film-forming method of the present invention, the DLC film displays the same effects as the operation and effects described above.

Moreover, when the DLC film is such that the arithmetic average roughness Ra based on the stylus type surface roughness measurement is equal to or less than 0.01 μm, and the ten point height of irregularities RzJIS based on the stylus type surface roughness measurement is 0.1 μm, or the arithmetic average roughness Ra based on the surface roughness measurement according to SPM is equal to or less than Ra 10 nm, and the ten point height of irregularities RzJIS based on the surface roughness measurement according to SPM is equal to or less than 150 nm, a DLC film with even better initial compatibility is able to be provided.

DESCRIPTION OF THE REFERENCE NUMERALS

26 ... DLC FILM   30 ... SUBSTRATE   42 ... TREATMENT CHAMBER
56 ... SECOND PUMP (LOW-VACUUM PUMP)

The invention claimed is:

1. A method for forming, inside a treatment chamber, a DLC film that covers at least a portion of a surface of a substrate, the DLC film-forming method comprising:
   a pretreatment process that is executed in a reduced pressure state of a predetermined treatment pressure generated by a low-vacuum pump, and that supplies Ar ions and H ions to the surface of the substrate by applying direct-current pulse voltage to the substrate, and generating plasma in an atmosphere that contains argon gas and hydrogen-based gas inside the treatment chamber; and
   a DLC deposition process that is executed after the pretreatment process in the reduced pressure state, and that forms a deposition layer of DLC on the surface of the substrate after the pretreatment process is executed, by applying direct-current pulse voltage to the substrate, and generating plasma in an atmosphere inside the treatment chamber, wherein:
   in the pretreatment process and the DLC deposition process, a treatment time of both of the processes, the predetermined treatment pressure in both of the processes, or a frequency, duty ratio, or voltage value of the direct-current pulse voltage applied to the substrate in both of the processes, is set such that a temperature of the substrate becomes equal to or less than 300° C.;
   the atmosphere inside the treatment chamber in the pretreatment process contains carbon-based gas and nitrogen-based gas; and
   the pretreatment process includes a first process in which the argon gas and the hydrogen-based gas contained in the atmosphere are at higher concentrations than the carbon-based gas and the nitrogen-based gas, and a second process that is executed following the first process, and in which the carbon-based gas and the nitrogen-based gas contained in the atmosphere are at higher concentrations than the argon gas and the hydrogen-based gas.

2. The DLC film-forming method according to claim 1, wherein the predetermined treatment pressure is set to equal to or less than 200 Pa in the DLC deposition process.

3. The DLC film-forming method according to claim 1, wherein the frequency of the direct-current pulse voltage applied to the substrate is equal to or greater than 1000 Hz in the DLC deposition process.

* * * * *